United States Patent
Diehl et al.

(10) Patent No.: US 7,642,780 B2
(45) Date of Patent: Jan. 5, 2010

(54) MAGNETIC RESONANCE SYSTEM WITH RADIO-FREQUENCY SHIELD WITH FREQUENCY-DEPENDENT SHIELDING EFFECT

(75) Inventors: Dirk Diehl, Erlangen (DE); Wolfgang Renz, Erlangen (DE); Lorenz-Peter Schmidt, Hessdorf (DE); Ulrich Von Knobloch, Munich (DE)

(73) Assignees: Siemens Aktiengesellschaft, Munich (DE); Friedrich-Alexander-Universitat Erlangen-Nurnberg, Erlangen (DE)

( * ) Notice: Subject to any disclaimer, the term of this patent is extended or adjusted under 35 U.S.C. 154(b) by 106 days.

(21) Appl. No.: 12/052,847

(22) Filed: Mar. 21, 2008

(65) Prior Publication Data
US 2008/0231276 A1 Sep. 25, 2008

(30) Foreign Application Priority Data
Mar. 23, 2007 (DE) ...................... 10 2007 014 135

(51) Int. Cl.
*G01V 3/00* (2006.01)
(52) U.S. Cl. ..................................... 324/318; 324/322
(58) Field of Classification Search ......... 324/300–322; 600/407–435
See application file for complete search history.

(56) References Cited

U.S. PATENT DOCUMENTS

| | | | | |
|---|---|---|---|---|
| 5,574,372 | A * | 11/1996 | Moritz et al. | 324/318 |
| 7,230,427 | B2 * | 6/2007 | Kimmlingen et al. | 324/318 |
| 7,282,918 | B2 * | 10/2007 | Freytag | 324/318 |

FOREIGN PATENT DOCUMENTS

WO   WO 01/67549   9/2001

* cited by examiner

*Primary Examiner*—Brij B Shrivastav
(74) *Attorney, Agent, or Firm*—Schiff Hardin LLP

(57) ABSTRACT

A magnetic resonance system has a basic magnet that generates a static basic magnetic field in an examination volume, and a whole-body antenna that emits a homogeneous radio-frequency field in the examination volume, the homogeneous radio-frequency field exhibiting an excitation frequency so that nuclei in an examination subject in the examination volume are excited to emit magnetic resonance signals, and a radio-frequency shield. The radio-frequency shield is arranged between the whole-body antenna and the basic magnet. The whole-body antenna is arranged between the radio-frequency shield and the examination volume. The radio-frequency shield is fashioned to exhibit a high shielding effect in a shielding frequency range that encompasses the excitation frequency. The shielding effect drops to a significantly lower shielding effect on both sides at side bands adjoining the shielding frequency range. The shielding frequency range and the side bands exhibit bandwidths that are significantly smaller than the excitation frequency.

11 Claims, 6 Drawing Sheets

MAGNETIC RESONANCE SYSTEM WITH RADIO-FREQUENCY SHIELD WITH FREQUENCY-DEPENDENT SHIELDING EFFECT

BACKGROUND OF THE INVENTION

1. Field of the Invention

The present invention concerns a magnetic resonance system, of the type having a basic magnet that operates a static basic magnetic field, in an examination volume, a whole-body antenna that emits a radio-frequency field in the examination volume, the radio-frequency field exhibiting an excitation frequency so that nuclei in an examination subject in the examination volume are excited to cause emission of magnetic resonance signals, and a radio-frequency shield between the whole-body antenna and the basic magnet, and wherein the whole-body antenna is arranged between the radio-frequency shield and the examination volume.

2. Description of the Prior Art

Magnetic resonance systems of the above type are generally known. In addition to the aforementioned components they normally have a gradient coil arrangement by means of which a gradient field is generated in the examination volume. The gradient coil arrangement is arranged between the basic magnet and the radio-frequency shield.

The radio-frequency shield has the goal of forming shielding currents in the radio-frequency shield in a predetermined manner in the transmission mode (thus when the whole-body antenna emits the radio-frequency field) such that the homogeneity of the radio-frequency field is maintained. The coupling of the radio-frequency field in the gradient coil arrangement should furthermore be prevented if a gradient coil arrangement is present. In the acquisition (reception) mode (thus when magnetic resonance signals are acquired from the examination volume by means of the whole-body antenna) the radio-frequency shield should prevent possible disruptions in the operation of the whole-body antenna emanating from the gradient coil arrangement.

In the ideal case, the radio-frequency shield is theoretically fashioned as an integrated, highly electrically conductive structure. In practice this embodiment is not possible since in this case high eddy currents would be induced by the gradient coil arrangement in the radio-frequency shield. The radio-frequency shield is therefore typically fashioned as a multi-level layer structure, with the layers being alternately electrically conductive and electrically insulating. The electrically conductive layers are slit. This embodiment of the radio-frequency shield (which is frequently used in practice) represents a compromise between various requirements.

It is advantageous to optimize the radio-frequency properties of the radio-frequency shield. This is primarily because in the course of the general development of magnetic resonance systems, the separation (spacing) of the radio-frequency shield from the whole-body antenna continuously decreases and the radio-frequency shield therefore always influences the properties of the whole-body antenna more strongly.

SUMMARY OF THE INVENTION

N object of the present invention is to design a radio-frequency shield for a magnetic resonance system such that the overall effectiveness of the magnetic resonance system is improved.

The object is achieved in a magnetic resonance system of the aforementioned type wherein the radio-frequency shield is fashioned such that it exhibits a high shielding effect in a shielding frequency range that encompasses the excitation frequency, the shielding effect drops to a significantly lower shielding effect on both sides at side bands adjoining the shielding frequency range, and the shielding frequency range and the side bands exhibit bandwidths that are significantly smaller than the excitation frequency.

The invention is based on the insight that the radio-frequency shield essentially must exhibit a good shielding effect only at the excitation frequency. In general the coils for other frequencies are fashioned as local coils and therefore are relatively far removed from radio-frequency shield. The radio-frequency shield therefore must exhibit a high shielding effect only in the region of the excitation frequency. In the normal case the excitation frequency is the frequency with which protons can be excited to magnetic resonance.

The term "significantly lower shielding effect" as used herein means that the shielding effect as a function of the frequency is significantly higher in the shielding frequency range than the minimum to which the shielding effect drops in the side bands. It is thus not merely a marginal fluctuation of the shielding effect but a significant maximum. The term "significantly less than the excitation frequency" means a relatively narrow maximum of the shielding effect as a function of the frequency.

In a preferred embodiment of the invention, the radio-frequency shield is resonant at a resonance frequency. The resonance frequency advantageously lies within the shielding frequency range.

The radio-frequency shield may exhibit at least one sub-region that is resonant at least one additional frequency that lies outside of the shielding frequency range. The additional frequency can hereby be used for a further function of the magnetic resonance system.

In a preferred embodiment the radio-frequency shield has a number of cells that form a structure repeating in at least one dimension (advantageously in two dimensions). An interval over which the structure repeats is advantageously smaller than one quarter of the free space wavelength corresponding to the excitation frequency, but this is not absolutely necessary.

Each cell can be coupled with each cell adjoining it via one impedance per coupling. In this case, the cells and the impedances can be matched to one another such that the structure is maximally resonant at the resonance frequency.

The radio-frequency shield can be formed by a number of layers that follow one another as viewed from the whole-body antenna to the basic magnet. In this case each layer contains only a part of the cells. In each layer, the cells only partially shield the whole-body antenna, such that coverage gaps exist with regard to that layer, at which coverage gaps the respective layer does not shield the whole-body antenna from the basic magnet. Nevertheless, a high shielding effect can be achieved when, for each layer, the coverage gaps thereof are covered (overlapped) by the cells of at least one of the other layers.

DESCRIPTION OF THE PREFERRED EMBODIMENTS

The present invention is subsequently explained in connection with a magnetic resonance system of the type known as a horizontal field magnetic resonance system, but the subsequent embodiments are also applicable for systems known as vertical field magnetic resonance systems.

Figure 1:
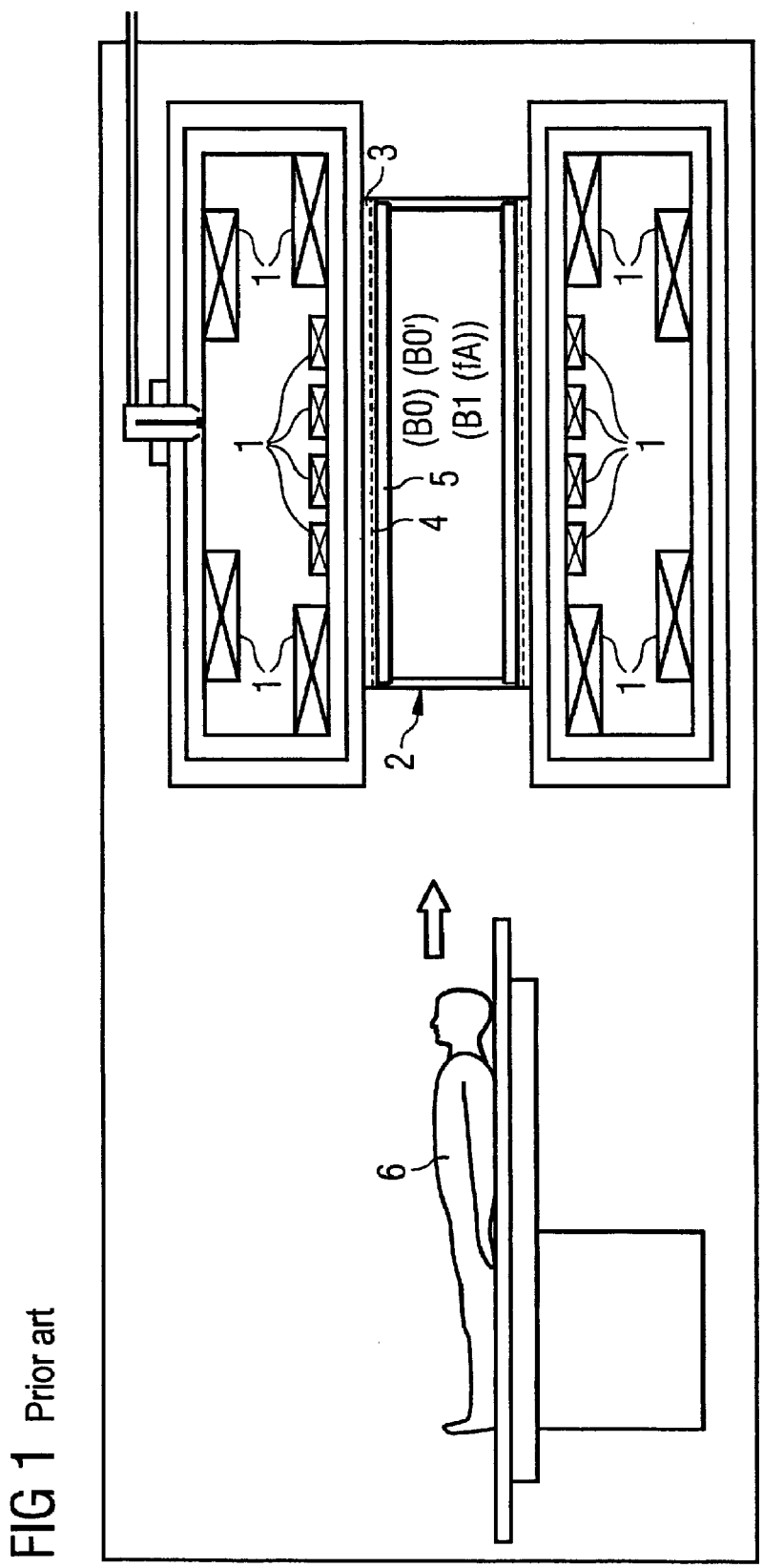
FIG. 1 schematically illustrates a magnetic resonance system.
Figure 2:
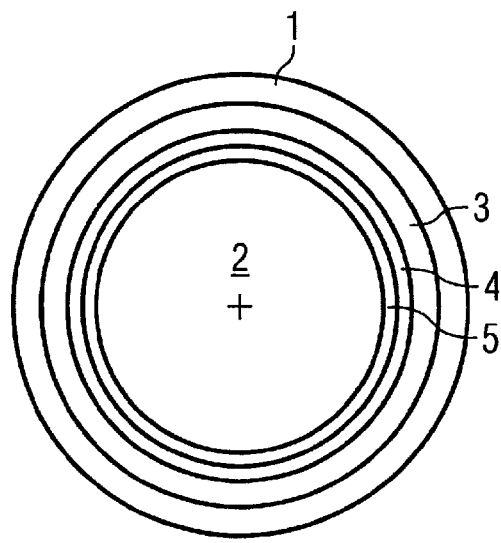
FIG. 2 is a cross-section through the magnetic resonance system of FIG. 1.

As is shown in FIGS. 1 and 2 the magnetic resonance system has a basic magnet 1. An examination volume 2 is exposed to a static basic magnetic field B0 by means of the basic magnet 1.

The magnetic resonance system normally furthermore has a gradient coil arrangement 3. A gradient field B0' is generated in the examination volume 2 by means of the gradient coil arrangement 3. The gradient coil arrangement 3 is arranged between the basic magnet 1 and the examination volume 2.

The magnetic resonance system furthermore has a radio-frequency shield 4. The radio-frequency shield 4 is arranged between the gradient coil arrangement 3 and the examination volume 2.

The magnetic resonance system also has a whole-body antenna 5. A homogeneous radio-frequency field B1 that exhibits an excitation frequency fA is generated in the examination volume 2 by the whole-body antenna 5. The excitation frequency fA is selected such that nuclei in an examination subject 6 in the examination volume 2 are excited so as to emit magnetic resonance signals. The whole-body antenna 5 is arranged between the radio-frequency shield 4 and the examination volume 2.

The design of the radio-frequency shield 4 is the basis of the present invention. The design of the radio-frequency shield 4 is subsequently explained in detail in connection with FIGS. 3 through 14.

Figure 3:
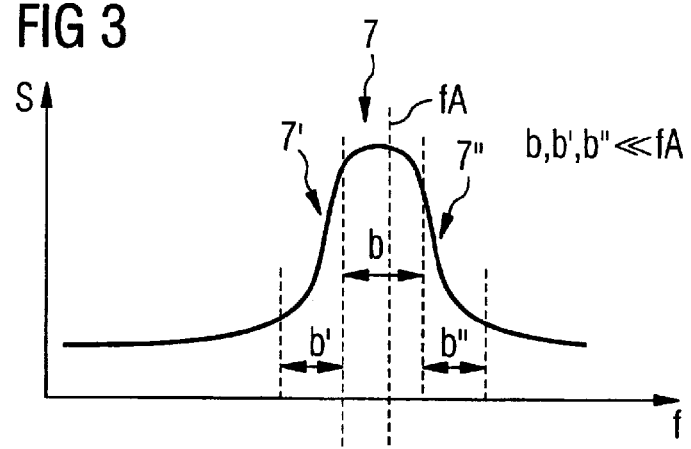
FIG. 3 is a graph showing the shielding effect of the radio-frequency shield as a function of frequency.

A shielding effect S of the radio-frequency shield 4 is shown in FIG. 3 as a function of the frequency f. According to FIG. 3 the radio-frequency shield 4 is fashioned such that the shielding effect S depends on the frequency f. The radio-frequency shield 4 in particular exhibits a high shielding effect S at the excitation frequency fA and in a shielding frequency range 7 around the excitation frequency fA. By contrast, the shielding effect S drops to a significantly lower value in side bands 7', 7" that adjoin the shielding frequency range 7 on both sides. The term "significantly lower" means that a simple maximum caused by random fluctuations of the shielding effect does not exist but rather a clearly recognizable effect maximum.

The shielding effect S normally decreases in the side bands 7', 7" to half the maximum shielding effect S, for the most part even below 50%, for example to 20%, 15% or 10%.

The shielding frequency range 7 exhibits a bandwidth b. The side bands 7', 7" exhibit bandwidths b', b" in an analogous manner. The bandwidths b, b', b" are significantly smaller than the excitation frequency fA. The shielding effect therefore exhibits a narrowband maximum in the range of the excitation frequency fA.

The bandwidths b, b', b" are normally smaller than 10% of the excitation frequency fA. For the most part they are even smaller and, for example, lie at 5%, 2%, 1% of the excitation frequency or event below that. The bandwidths b, b', b" can exhibit the same value or be values differing from one another.

Figure 4:
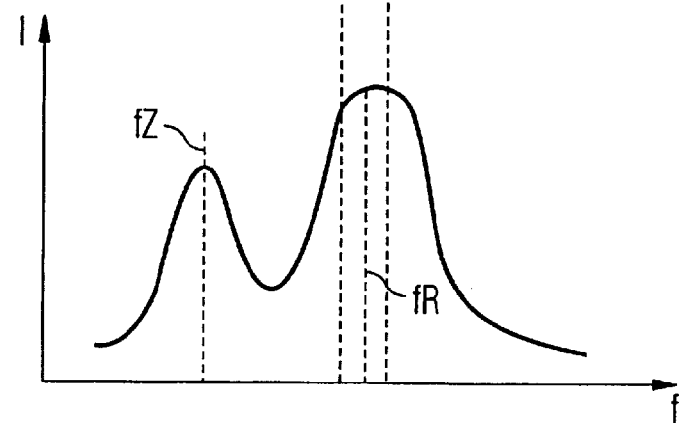
FIG. 4 is a graph showing the shielding current as a function of frequency.

A shielding current I is presented in FIG. 4 as a function of the frequency f of the radio-frequency field B1. The amplitude of the radio-frequency field B1 is hereby assumed as a constant. According to FIG. 4 the radio-frequency shield 4 is resonant at a resonance frequency fR. The resonance frequency fR can lie outside of the shielding frequency range 7.

According to FIG. 4, however, the resonance frequency fR lies within the shielding frequency range 7. The resonance frequency fR can in particular be identical to the excitation frequency fA. Alternatively, it can exhibit a value differing therefrom.

Figure 5:
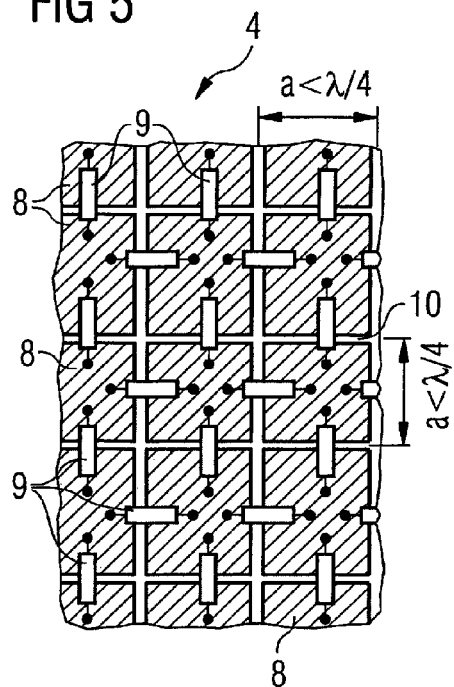
FIGS. 5 through 11 respectively show portions of a radio-frequency shield in accordance with the invention.
Figure 6:
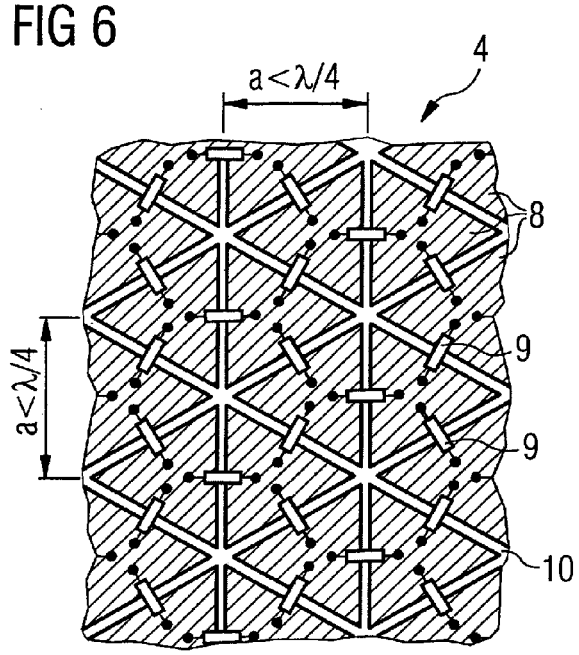
Figure 7:
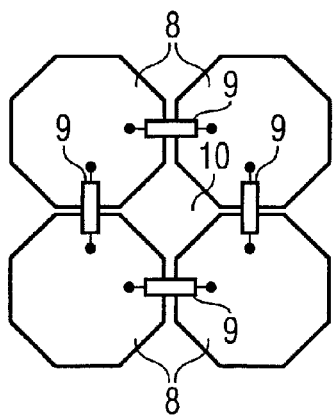

According to the exemplary embodiment of FIG. 5 the radio-frequency shield 4 can, include a number of cells 8. The cells 8 form a structure that repeats at least in one dimension, advantageously in two dimensions. Eddy currents that are induced, for example, by gradient fields are reduced to a minimum by this design.

An interval a at which the structure repeats can in principle exhibit an arbitrary value. In the embodiment of FIG. 5, the interval is smaller than one quarter of a free space wavelength λ that corresponds to the excitation frequency fA. The free space wavelength λ and the excitation frequency fA thus satisfy the equality fA·λ=c, wherein c is the speed of light in a vacuum.

According to FIG. 5 (and also according to FIG. 6 through 8) the interval a is the same in both dimensions, but the interval a could also be direction-dependent.

According to FIG. 5, each cell 8 is coupled with every cell 8 adjoining it via one impedance 9 per coupling. The impedances 9 can be fashioned as discrete structural elements. However, if the radio-frequency shield has a number of layers a capacitive coupling of the cells 8 can alternatively be realized by the design of the layers. The capacitive coupling of the cells 8 achieves the impedances in this case.

The cells 8 and the impedances 9 are advantageously matched to one another such that the structure is maximally resonant at the resonance frequency fR. The structure thus acts as if it is closed for a wave with the resonance frequency fR, such that a full reflection is achieved. For the resonance frequency fR the radio-frequency shield 4 thus behaves like a solid conductive surface.

According to FIG. 5 the cells 8 are fashioned as rectangles. Such an embodiment is preferred because rectangles can be produced more simply in terms of manufacturing and a good degree of coverage can nevertheless be achieved. Only small coverage gaps 10 that can be tolerated in many cases remain between the cells 8. However, an embodiment of the cells 8 as rectangles is not absolutely necessary. According to FIG. 6, the cells 8 could also be fashioned as hexagons. It is even possible (see FIG. 7) to configure the cells 8 in a different shape, for example as a regular octagon. However, in this case larger coverage gaps 10 remain. The coverage gaps 10 can possibly be filled with smaller quadratic cells (not shown in FIG. 7).

Figure 8:
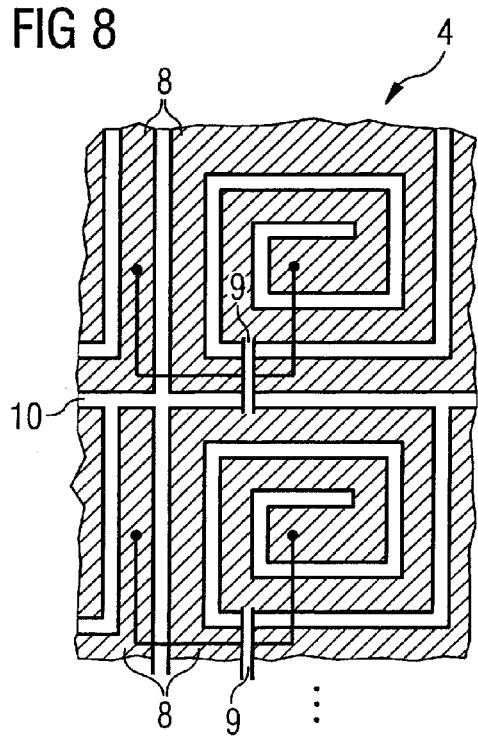

In the simplest case the cells 8 are unstructured, electrically conductive surfaces. According to FIG. 8, however, the cells 8 can also be internally structured, for example helically as shown in FIG. 8. Such an embodiment exhibits the advantage that eddy currents occurring in the cells 8 are distinctly smaller than according to the embodiments of FIG. 5 through 7.

Figure 9:
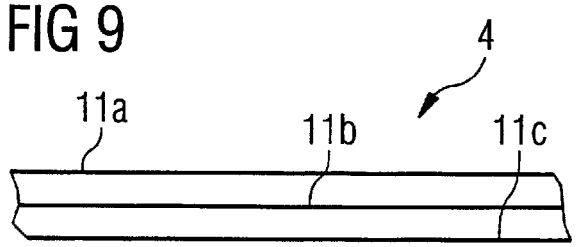
Figure 10:
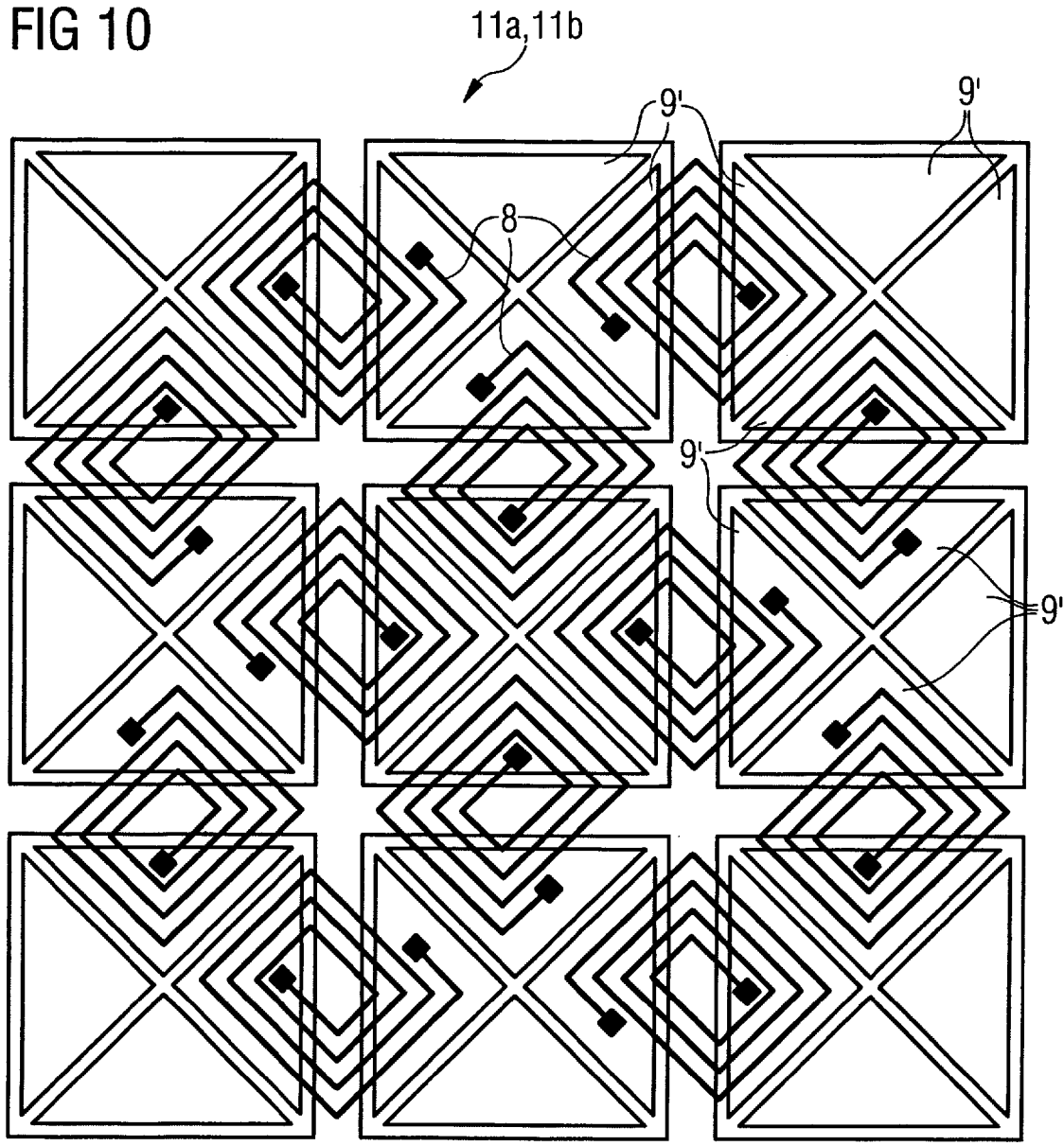
Figure 11:
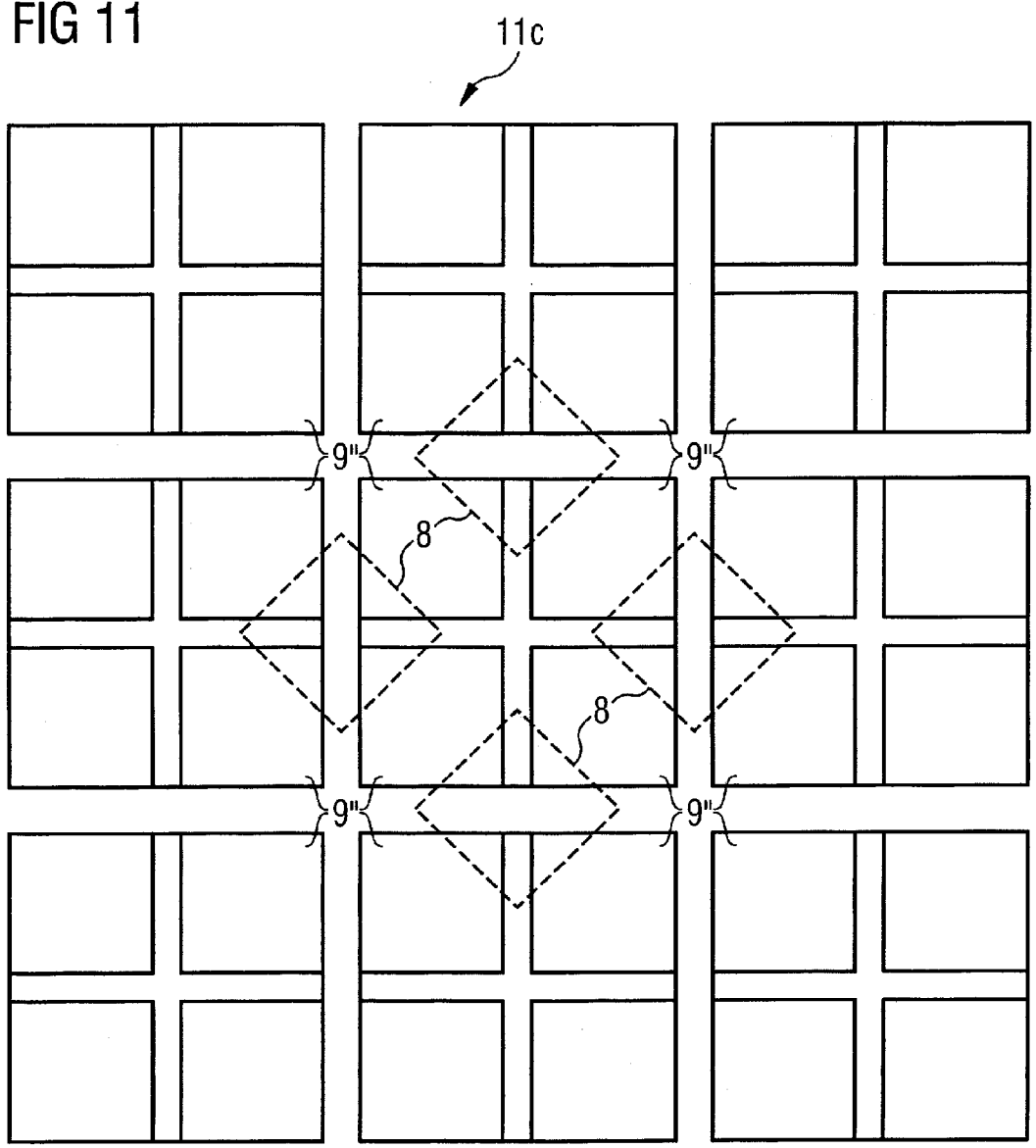

An embodiment of the structure in which the impedances 9 are realized by suitable design of layers 11 of the radio-frequency shield 4 is shown in FIG. 9 through 11.

According to FIG. 9, the radio-frequency shield 4 has three electrically conductive layers 11 with a dielectric layer between each successive pair. The dielectric layers are not shown in FIG. 9. Furthermore, the layers 11 in FIG. 9 (and also in FIGS. 10 and 11) can respectively be provided with a lowercase letter (a through c) in order to be able to be able to linguistically differentiate them from one another.

According to FIG. 10 the cells 8 are arranged in the layer 11a. The cells 8 are advantageously fashioned helically (see above statements regarding FIG. 8) and act as inductors. First capacitor surfaces 9' of the coupling impedances 9 are arranged in the layer 11b. The cells 8 are capacitively coupled with second coupling surfaces 9" of the impedances 9 (which are arranged in the layer 11c according to FIG. 11) via the first capacitor surfaces 9'.

The locations of the cells 8 are arranged dashed in FIG. 11. This representation should clarify the corresponding locations of the layer 11c relative to the layers 11a and 11b.

A further embodiment of the inventive radio-frequency shield 4 is explained in the following in connection with FIGS. 12 and 13. This embodiment of the invention can be combined with the embodiments described above in FIGS. 5 through 11.'

Figure 12:
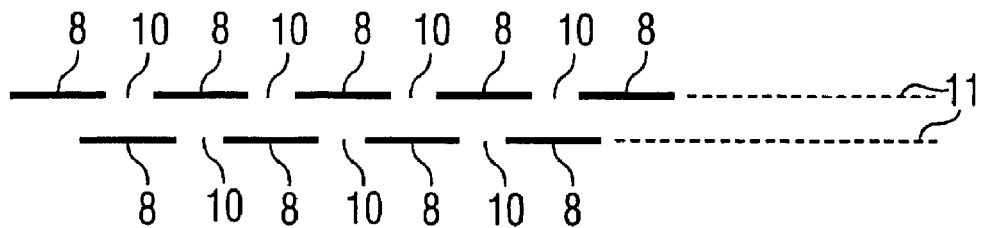
FIG. 12 shows a portion of a further embodiment of a radio-frequency shield in accordance with the invention.
Figure 13:
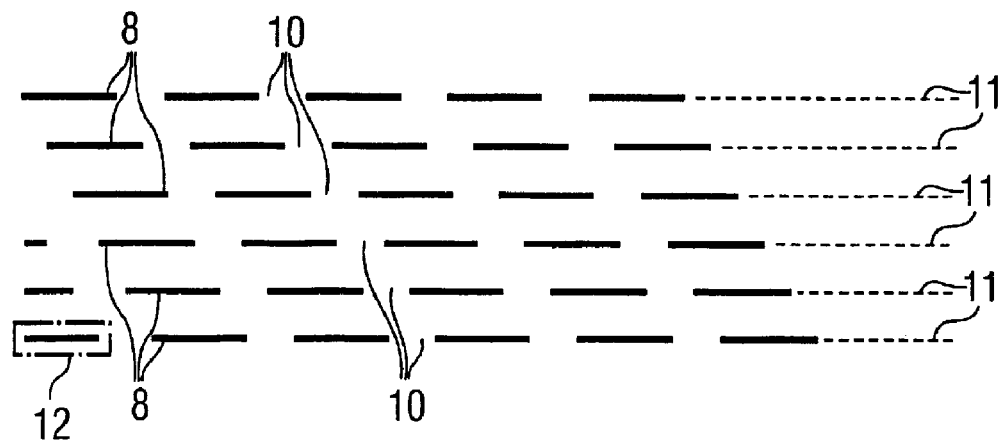
FIGS. 13 and 14 respectively show a radio-frequency shield in cross-section in accordance with the invention.

According to FIGS. 12 and 13, the radio-frequency shield 4 has a number of layers 11. The layers 11 follow one another as viewed from the whole-body antenna 5 to the basic magnet 1. Each layer 11 includes a portion of the total cells 8. With regard to each layer 11, the cells 8 of the respective considered layer 11 only partially shield the whole-body antenna 5. The coverage gaps 10 that have already been mentioned in connection with FIG. 5 through 8 thus remain with regard to the respective layer 11. The respective layer 11 does not shield the whole-body antenna 5 from the basic magnet 1 (and also not from the gradient coil arrangement 3) at the coverage gaps 10. The coverage gaps 10 of the respective layer 11 are, however, covered by the cells 8 of at least one of the other layers 11.

Figure 14:
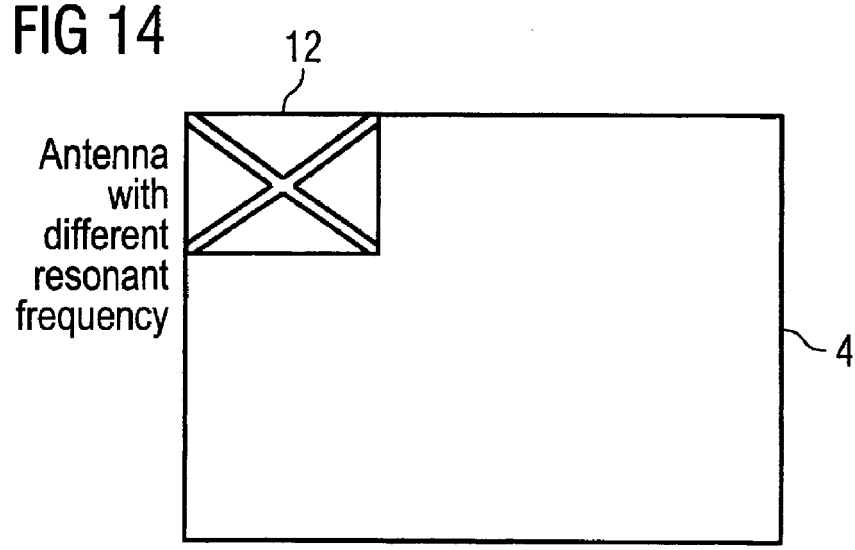

FIG. 14 shows a further embodiment of the inventive radio-frequency shield 4. This embodiment can also be combined with the embodiments already described in the preceding.

According to FIG. 14, the radio-frequency shield 4 has at least one sub-region 12. The sub-region 12 is resonant at an additional frequency fZ (see FIG. 4). The additional frequency fZ advantageously is outside of the shielding frequency range 7.

The switching function fZ can be used for a further function of the magnetic resonance system. For example, the additional frequency fZ can be used in order to address a transponder that is integrated into the radio-frequency shield 4. Alternatively, the sub-region 12 can act as an antenna via which communication is effected with local coils (not shown) of the magnetic resonance system. In both possible application cases the sub-region 12 can be fashioned, for example, as what is known as a dog bone structure or as a Latin cross.

The arrangement of the sub-region 12 is in principle arbitrary, but the sub-region 12 is advantageously arranged at the edge of the shielding structure 4 and in one of the outer layers 11 (see FIGS. 9 and 14).

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance system comprising:
    a basic field magnet that generates a static, basic magnetic field in an examination volume;
    a whole-body antenna that emits a homogenous radio-frequency field in the examination volume, said radio-frequency field exhibiting an excitation frequency that causes atomic nuclei in an examination subject in the examination volume to be excited to emit magnetic resonance signals;
    a radio-frequency shield disposed between the whole body antenna and the basic field magnet;
    the whole body antenna being disposed between the radio-frequency shield and the examination volume; and
    said radio-frequency shield being configured to produce a high shielding effect in a shielding frequency range that encompasses said excitation frequency and that drops to a substantially lower shielding effect at both sides of said shielding frequency range at sidebands adjoining the shielding frequency range, and wherein said shielding frequency range and said sidebands each exhibits a bandwidth that is substantially smaller than said excitation frequency.

2. A magnetic resonance system as claimed in claim 1 wherein said radio-frequency shield is configured to be resonant at a resonance frequency.

3. A magnetic resonance system as claimed in claim 2 wherein said resonance frequency is within said shielding frequency range.

4. A magnetic resonance system as claimed in claim 3 wherein said radio-frequency shield is configured to have at least one sub-range that is resonant at at least one additional frequency that is outside of said shielding frequency range.

5. A magnetic resonance system as claimed in claim 4 wherein said additional frequency is suited for a non-excitation function of said magnetic resonance system.

6. A magnetic resonance system as claimed in claim 1 wherein said radio-frequency shield comprises a plurality of cells forming a structure that repeats in at least one spatial dimension.

7. A magnetic resonance system as claimed in claim 6 wherein said cells repeat in an interval that is smaller than one quarter of a free space wavelength corresponding to the excitation frequency.

8. A magnetic resonance system as claimed in claim 6 wherein each of said cells is coupled with an adjoining cell via one impedance per coupling.

9. A magnetic resonance system as claimed in claim 8 wherein said cells and the impedances are matched to make said structure maximally resonant at a resonant frequency.

10. A magnetic resonance system as claimed in claim 6 wherein said radio-frequency shield comprises a plurality of successive layers proceeding from said whole body antenna to said basic magnet, with each layer comprising a portion of said cells, and wherein, in each of said layers, the cells therein only partially shield the whole body antenna with coverage gaps in that layer, and wherein said layers are arranged relative to each other so that each coverage gap in each layer is overlapped by a cell in another of said layers.

11. A magnetic resonance system as claimed in claim 1 comprising a gradient coil arrangement that generates a gradient field in the examination volume, said gradient coil arrangement being disposed between said basic field magnet and said radio-frequency shield.

* * * * *